United States Patent
Renn et al.

(10) Patent No.: US 12,387,993 B2
(45) Date of Patent: Aug. 12, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Tai-Shin Renn, Taichung (TW); Kuo-Hua Yu, Taichung (TW); Yu-Min Lo, Taichung (TW); Wei-Shen Hung, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 483 days.

(21) Appl. No.: 17/956,566

(22) Filed: Sep. 29, 2022

(65) Prior Publication Data
US 2023/0223316 A1 Jul. 13, 2023

(30) Foreign Application Priority Data
Jan. 11, 2022 (TW) .................................. 111101117

(51) Int. Cl.
| | | |
|---|---|---|
| H01L 23/367 | (2006.01) | |
| H01L 21/48 | (2006.01) | |
| H01L 21/56 | (2006.01) | |
| H01L 23/00 | (2006.01) | |
| H01L 23/498 | (2006.01) | |
| H01L 25/10 | (2006.01) | |

(52) U.S. Cl.
CPC ...... *H01L 23/3677* (2013.01); *H01L 21/4853* (2013.01); *H01L 21/4882* (2013.01); *H01L 21/568* (2013.01); *H01L 23/49816* (2013.01); *H01L 23/49833* (2013.01); *H01L 23/49838* (2013.01); *H01L 24/16* (2013.01); *H01L 24/32* (2013.01); *H01L 24/73* (2013.01); *H01L 25/105* (2013.01); H01L 2224/16225 (2013.01); H01L 2224/32225 (2013.01); H01L 2224/73204 (2013.01); H01L 2225/1023 (2013.01); H01L 2225/1058 (2013.01); H01L 2225/1094 (2013.01); H01L 2924/3511 (2013.01)

(58) Field of Classification Search
CPC ............. H01L 23/3677; H01L 21/4853; H01L 21/4882
See application file for complete search history.

(56) References Cited

U.S. PATENT DOCUMENTS

| | | | | |
|---|---|---|---|---|
| 10,283,473 | B1 * | 5/2019 | Yu | H01L 21/56 |
| 2009/0160053 | A1 * | 6/2009 | Meyer | H01L 21/568 |
| | | | | 257/E23.141 |
| 2013/0277821 | A1 * | 10/2013 | Lundberg | H01L 23/3677 |
| | | | | 257/713 |

* cited by examiner

*Primary Examiner* — Errol V Fernandes
(74) *Attorney, Agent, or Firm* — Studebaker Brackett PLLC (57) ABSTRACT

An electronic package is provided, in which an electronic element is disposed on an upper side of a circuit structure, a package layer covers the electronic element, and an action structure is embedded in the package layer, so that the action structure is exposed from a surface of the package layer, and then a bonding element is disposed on a lower side of the circuit structure and corresponding to the position of the action structure, so as to form a thermal conduction between the bonding element and the action structure. Therefore, a laser can transfer heat energy to the bonding element via the action structure, so that a solder material on the bonding element can be reflowed.

14 Claims, 6 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package with a heat dissipation mechanism and a manufacturing method thereof.

2. Description of Related Art

With the evolution of technology, the demand trend of electronic products is moving towards high-end products with high-density lines/high transmission speed/high number of stacked layers/large-size designs. These products are more sensitive to thermal reactions as the chip size increases and the number of contacts (I/O) increases. Therefore, the thermal process (such as the reflow process) in the packaging operation is very likely to cause warpage of the overall structure due to different coefficients of thermal expansion (CTE) of various materials, and the problem of poor reliability would also occur due to the concentration of thermal stress inside the structure.

At present, the laser assisted bonding (LAB) process may selectively perform a local heating, and has the characteristics of rapid temperature rise. Therefore, the thermal process time can be greatly reduced, thereby reducing the thermal stress concentration inside the structure, and by controlling the laser wavelength and the characteristics of local heating, the degree of warpage can be greatly reduced.

Figure 1:
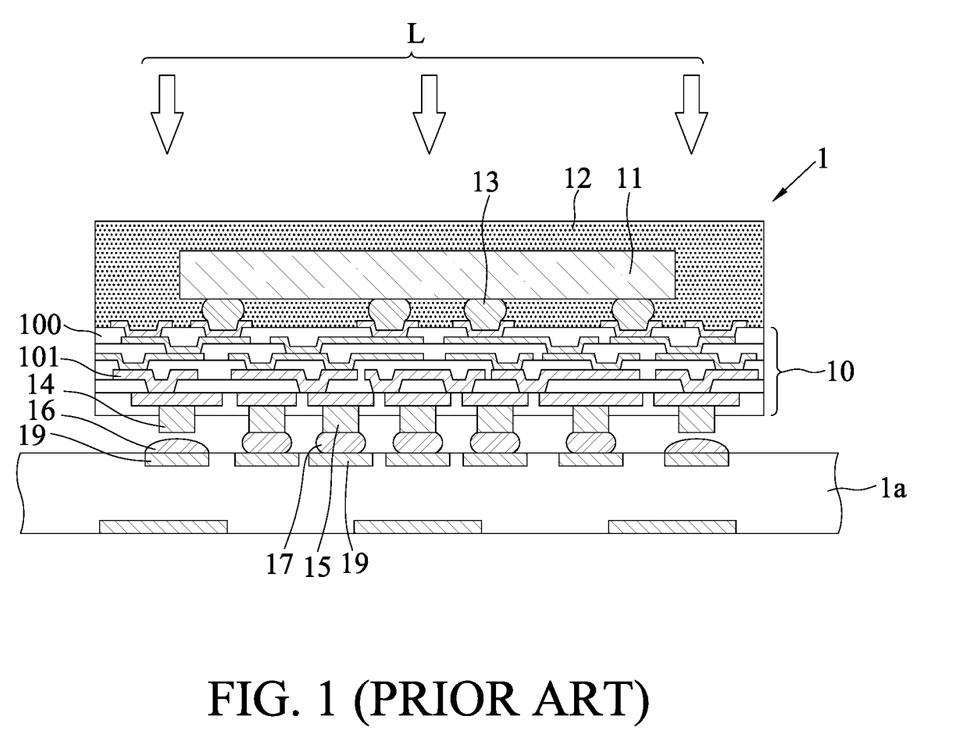
FIG. 1 is a schematic cross-sectional view of a conventional semiconductor package.

FIG. 1 is a schematic view of a conventional semiconductor package 1. As shown in FIG. 1, the semiconductor package 1 is provided with a semiconductor chip 11 that is disposed on a substrate structure 10 having a dielectric layer 100 and a routing layer 101 in a flip-chip manner (via solder bumps 13), and the semiconductor chip 11 is then covered with a package layer 12. Afterwards, conductive bumps 14, 15 on the lower side of the substrate structure 10 can connect a plurality of solder materials 16, 17 onto contacts 19 of a circuit board 1a via the LAB process.

However, during the LAB process, the thermal energy of a laser L can only penetrate through the semiconductor chip 11 but cannot penetrate through the package layer 12, resulting in insufficient thermal energy of the conductive bumps 14 under the package layer 12, and thus causing the problem of non-wetting of the solder materials 16 there.

Therefore, how to overcome the above-mentioned drawbacks of the prior art has become an urgent issue to be solved at present.

SUMMARY

In view of the various deficiencies of the prior art, the present disclosure provides an electronic package, which comprises: a circuit structure having a first side and a second side opposing the first side; an electronic element disposed on the first side of the circuit structure; a package layer disposed on the first side of the circuit structure to cover the electronic element; at least one action structure embedded in the package layer and located around the electronic element, wherein the action structure is exposed from an upper surface of the package layer and connected to the first side of the circuit structure; and at least one bonding element disposed on the second side of the circuit structure and corresponding to a position of the action structure, wherein a thermal conduction is formed between the bonding element and the action structure.

The present disclosure further provides a method of manufacturing an electronic package, the method comprises: providing a circuit structure having a first side and a second side opposing the first side; disposing an electronic element on the first side of the circuit structure; forming a package layer on the first side of the circuit structure to cover the electronic element, and embedding at least one action structure in the package layer around the electronic element, wherein the action structure is exposed from an upper surface of the package layer and connected to the first side of the circuit structure; and forming at least one bonding element on the second side of the circuit structure, wherein the bonding element corresponds to a position of the action structure, such that a thermal conduction is formed between the bonding element and the action structure.

In the aforementioned method, the action structure is first formed on the first side of the circuit structure, and then the package layer covers the action structure and the electronic element together.

In the aforementioned method, after disposing the electronic element on the first side of the circuit structure, the package layer is made to cover the electronic element, and then a through via exposing the first side is formed on the package layer, and then a metal material is filled in the through via to form the action structure.

In the aforementioned electronic package and the manufacturing method thereof, the action structure includes a pillar free from having electrical function.

In the aforementioned electronic package and the manufacturing method thereof, the action structure is connected to a functional part of the circuit structure.

In the aforementioned electronic package and the manufacturing method thereof, the circuit structure includes a fan-out redistribution layer.

In the aforementioned electronic package and the manufacturing method thereof, the action structure includes a pillar, and the pillar is used as a center and forms a circular heat-affected zone by two to three times a radius of the pillar, wherein the heat-affected zone is projected vertically in a direction from the first side to the second side to define a heat channel in the circuit structure, such that the bonding element at least partially and correspondingly falls within a range of the heat channel.

In the aforementioned electronic package and the manufacturing method thereof, the action structure includes a plurality of pillars, such that the single bonding element corresponds to at least two of the pillars.

In the aforementioned electronic package and the manufacturing method thereof, the action structure includes at least one pillar, such that the single pillar corresponds to a plurality of the bonding elements.

In the aforementioned electronic package and the manufacturing method thereof, the action structure includes at least one pillar, and a ratio of a diameter of the pillar to a diameter of the bonding element is 0.2 to 0.4 or 0.8 to 1.2.

As can be seen from the above, in the electronic package and the manufacturing method thereof of the present disclosure, the action structure is embedded in the package layer and exposed from the surface of the package layer, so that the laser can transfer heat energy to the bonding element on the second side of the circuit structure via the action structure, such that the solder material on the bonding element can be reflowed. Therefore, compared with the prior art, the present disclosure can effectively improve the problem of non-wetting of the solder material on the bonding element.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "lower," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2D are schematic cross-sectional views illustrating a manufacturing method of an electronic package 2 of the present disclosure.

Figure 2A:
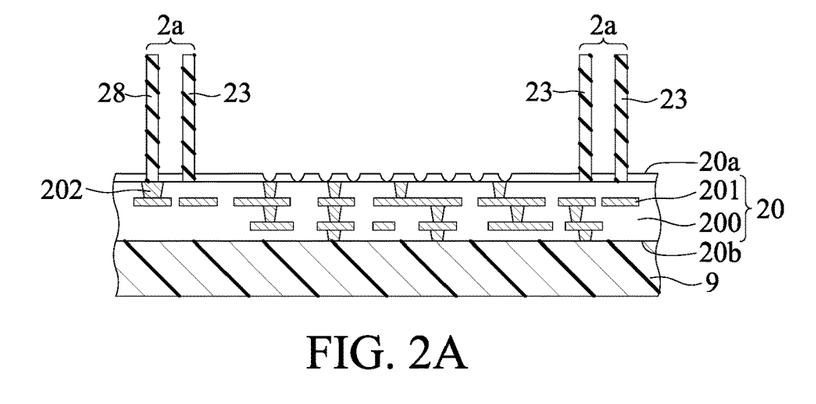
FIG. 2A to FIG. 2D are schematic cross-sectional views illustrating a manufacturing method of an electronic package according to the present disclosure.

As shown in FIG. 2A, a circuit structure 20 is arranged on a support board 9, and an action structure 2a including a plurality of first pillars 23 or including a first pillar 23 and a second pillar 28 is formed on the circuit structure 20.

In one embodiment, the support board 9 is, for example, a board body made of semiconductor material (e.g., silicon or glass), and the circuit structure 20 is, for example, a package substrate with a core layer, a coreless package substrate, a through silicon interposer (TSI) with a through-silicon via (TSV), or other board types, wherein the circuit structure 20 has a first side 20a and a second side 20b opposite to the first side 20a, so that the circuit structure 20 is bonded onto the support board 9 with the second side 20b thereof. For example, the circuit structure 20 includes at least one insulating layer 200 and at least one routing layer 201 bonded with the insulating layer 200, such as at least one fan-out type redistribution layer (RDL), and the circuit structure 20 further has at least one functional part 202, such as for signal transmission or for grounding. It should be understood that the circuit structure 20 can also be other substrates for carrying chips, such as lead frames, wafers, or other board bodies with metal routings, etc., which are not limited to the above.

Furthermore, the plurality of first pillars 23 and the second pillar 28 are erected or vertically disposed on the first side 20a of the circuit structure 20, and the second pillar 28 can be connected to the functional part 202 of the circuit structure 20 according to requirements. For example, the material for forming the first and second pillars 23, 28 is a metal material such as copper, a solder material, or other materials that are easy to conduct heat.

In addition, the routing method of the circuit structure 20 is a fan-out redistribution layer (FORDL), so a pitch of the routing layer 201 fans out from a smaller pitch of the first side 20a to a larger pitch of the second side 20b, that is, the pitch of the routing layer 201 on the first side 20a is smaller than the pitch of the routing layer 201 on the second side 20b.

Figure 2B:
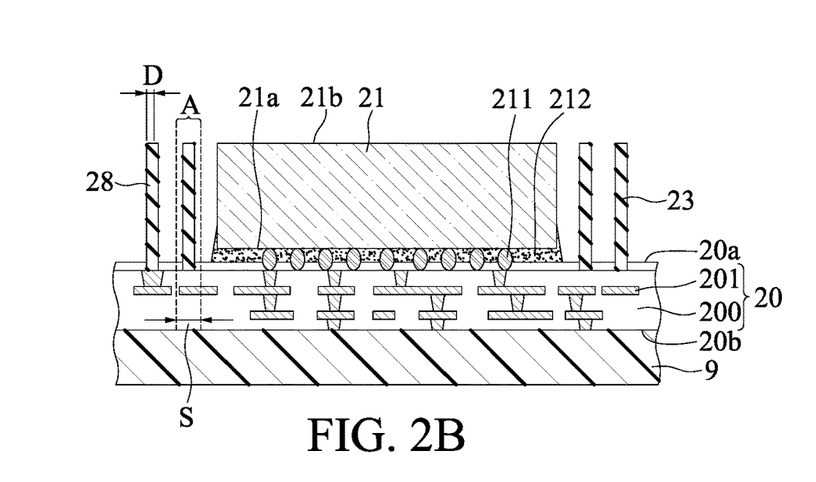

As shown in FIG. 2B, at least one electronic element 21 is disposed on the first side 20a of the circuit structure 20, and the first pillars 23 are free from being electrically connected to the electronic element 21 to serve as dummy vias.

In one embodiment, the electronic element 21 is an active element, a passive element or a combination of the active element and the passive element, etc., wherein the active element is, for example, a semiconductor chip, and the passive element is, for example, a resistor, a capacitor, or an inductor. In one embodiment, the electronic element 21 is a semiconductor chip, which has an active surface 21a and an inactive surface 21b opposite to the active surface 21a, wherein the active surface 21a has a plurality of electrode pads, so as to be disposed on the first side 20a of the circuit structure 20 in a flip chip manner by a plurality of conductive bumps 211 such as solder material, metal pillars or the like and electrically connected to the routing layer 201 with the smaller pitch, so that these high-density electrode pads or conductive bumps 211 can be fanned out via the circuit structure 20 to contacts on the second side 20b with the larger pitch, and the conductive bumps 211 are covered with an insulating material 212 such as an underfill or a non-conductive underfill thin film (NCF); alternatively, the electronic element 21 can be electrically connected to the routing layer 201 of the circuit structure 20 via a plurality of bonding wires (not shown) in a wire bonding manner; or the electronic element 21 may directly contact the routing layer 201 of the circuit structure 20. Therefore, there are many ways in which the electronic element 21 is electrically connected to the circuit structure 20, which are not limited to the above.

Furthermore, the first and second pillars 23, 28 are located around the electronic element 21, such as surrounding the electronic element 21, with the first and second pillars 23, 28 as the center and with two to three times its radius D forming a circular heat-affected zone A, so that the heat-affected zone A is projected vertically in a direction from the first side 20a to the second side 20b, so as to define a cylindrical heat channel S in the circuit structure 20. It can be understood that the size of the circular heat-affected zone A varies with the thermal diffusivity of the material of the first and second pillars 23, 28. In an embodiment, the first and second pillars 23, 28 are made from copper, but the present disclosure is not limited to as such.

It should be understood that, in other embodiments, the electronic element 21 can also be disposed on the circuit structure 20 first, and then the first and second pillars 23, 28 are formed.

Figure 2C:
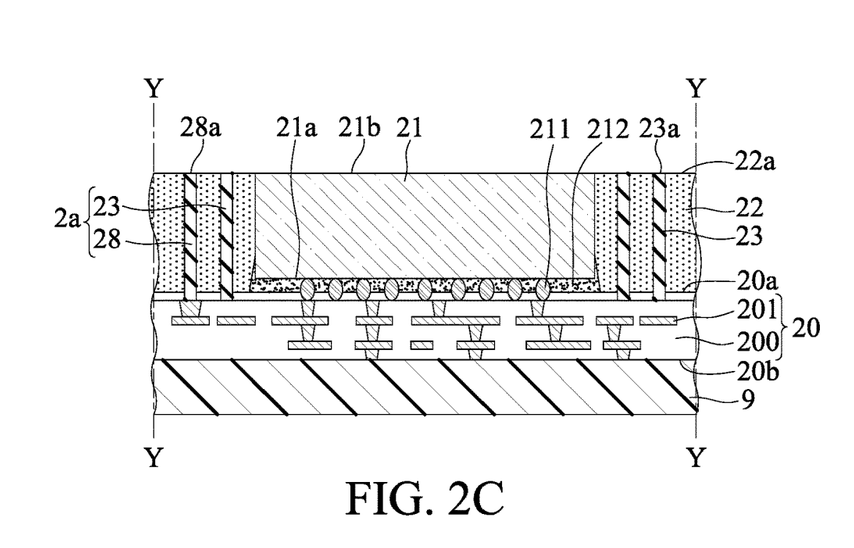

As shown in FIG. 2C, a package layer 22 is formed on the first side 20a of the circuit structure 20, so that the package layer 22 covers the electronic element 21 and the action structure 2a together, such that part of the surface (such as the upper surfaces of the first and second pillars 23, 28) of the action structure 2a is exposed from the package layer 22.

In one embodiment, the package layer 22 is an insulating material, such as polyimide (PI), dry film, encapsulant such as epoxy resin, or molding compound.

Furthermore, a surface 22a of the package layer 22 can be flushed with the inactive surface 21b of the electronic element 21 and end surfaces 23a and 28a of the first and second pillars 23 and 28 via a leveling process, so that the inactive surface 21b of the electronic element 21 and the end surfaces 23a and 28a of the first and second pillars 23 and 28 are exposed from the surface 22a of the package layer 22. For example, the leveling process removes part of the material of the electronic element 21, part of the material of the action structure 2a and part of the material of the package layer 22 by grinding. It should be understood that, the package layer 22 can also expose the inactive surface 21b of the electronic element 21 and the end surfaces 23a and 28a of the first and second pillars 23 and 28 in the form of openings.

Figure 4A:
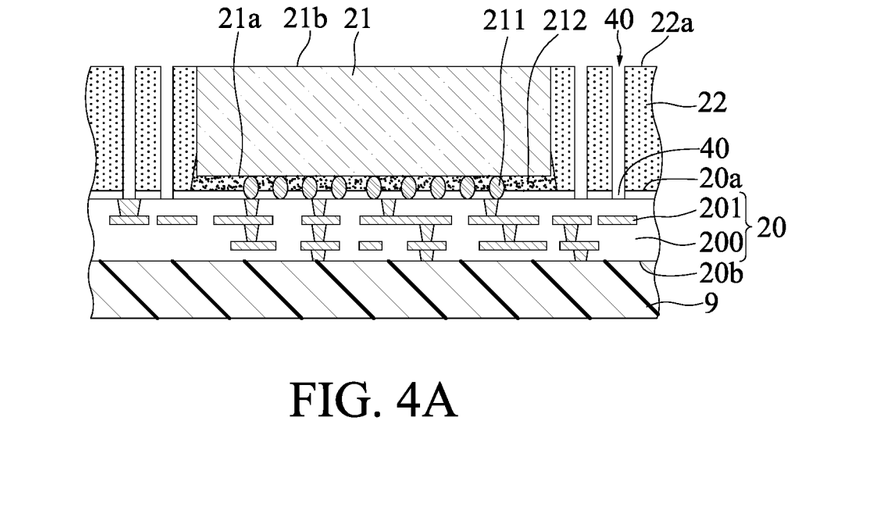
FIG. 4A is a schematic cross-sectional view illustrating another method of FIG. 2B to FIG. 2C.

Also, in another embodiment, as shown in FIG. 4A, after the electronic element 21 is disposed on the circuit structure 20, the package layer 22 may be formed first, and then at least one or a plurality of through vias 40 exposing the insulating layer 200 (even exposing the functional part 202) are formed on the package layer 22. Afterwards, an easily thermally conductive material is formed in the through vias 40 to serve as the action structure 2a.

Figure 2D:
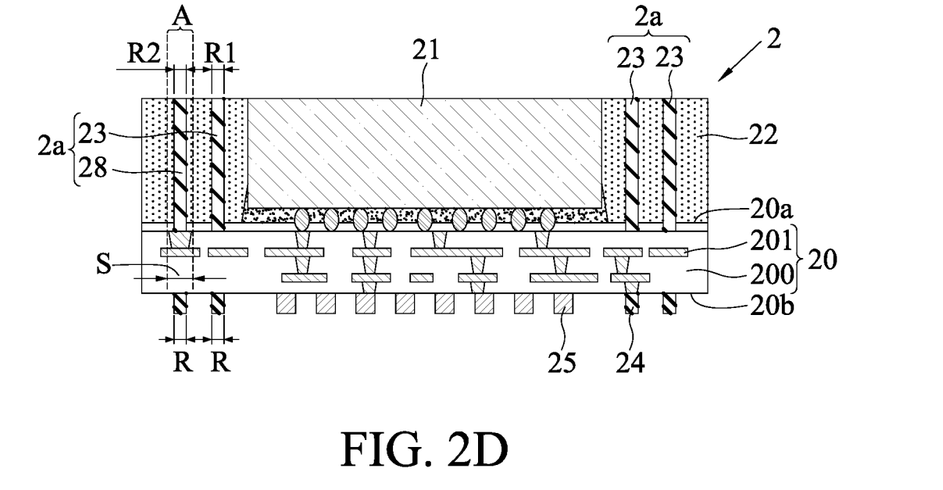

As shown in FIG. 2D, the support board 9 is removed to expose the second side 20b of the circuit structure 20, and a singulation process is performed along a cutting path Y shown in FIG. 2C. Next, a plurality of bonding elements 24 and a plurality of conductive elements 25 are formed on the second side 20b of the circuit structure 20 to form the electronic package 2 of the present disclosure, wherein the bonding elements 24 and the conductive elements 25 are electrically connected to the routing layer 201, so that the electronic element 21 is electrically connected to the conductive elements 25 and the bonding elements 24.

In one embodiment, positions of the first and second pillars 23, 28 and the bonding elements 24 are respectively disposed on the first side 20a and the second side 20b of the circuit structure 20, so that the positions of the first and second pillars 23, 28 and the bonding elements 24 are arranged to be correspond to each other up and down.

Furthermore, the bonding elements 24 and the conductive elements 25 are metal bumps such as copper or other conductive materials, and the materials of the bonding elements 24, the conductive elements 25 and the conductive bumps 211 can be the same or different.

Figure 3A:
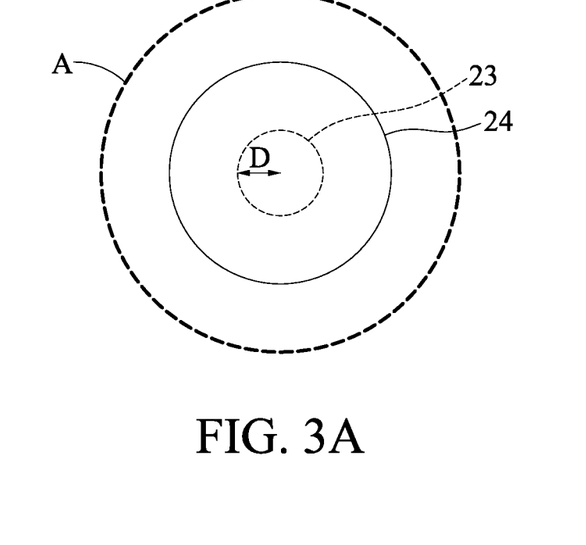
FIG. 3A to FIG. 3D are schematic partial bottom views of FIG. 2D.
Figure 3B:
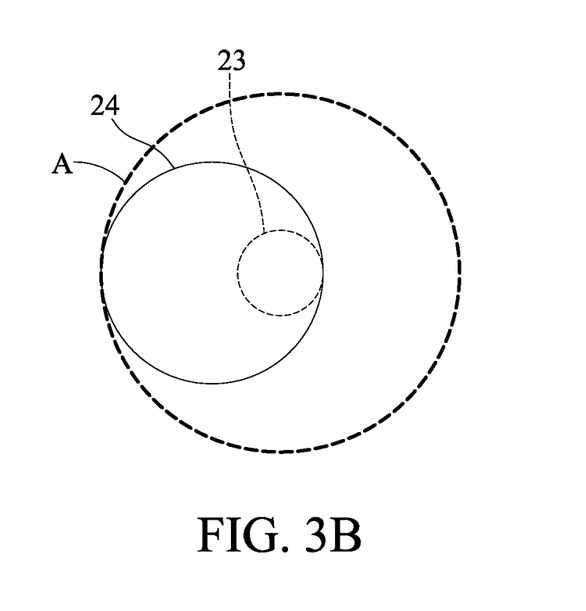

In addition, the bonding element 24 is correspondingly at least partially within the range of the heat channel S defined by the circular heat-affected zone A. For example, the bonding element 24 entirely falls into the range of the heat channel S in a concentric manner relative to the first pillar 23, as shown in FIG. 3A; or the bonding element 24 entirely falls into the range of the heat channel S in an eccentric manner relative to the first pillar 23, as shown in FIG. 3B. In other words, the relative positions of the first pillar 23 and the bonding element 24 can be in a center-aligned relationship (as shown in FIG. 3A) or a non-aligned relationship (as shown in FIG. 3B), as long as the position of the bonding element 24 intersects the heat channel S will do.

Figure 3C:
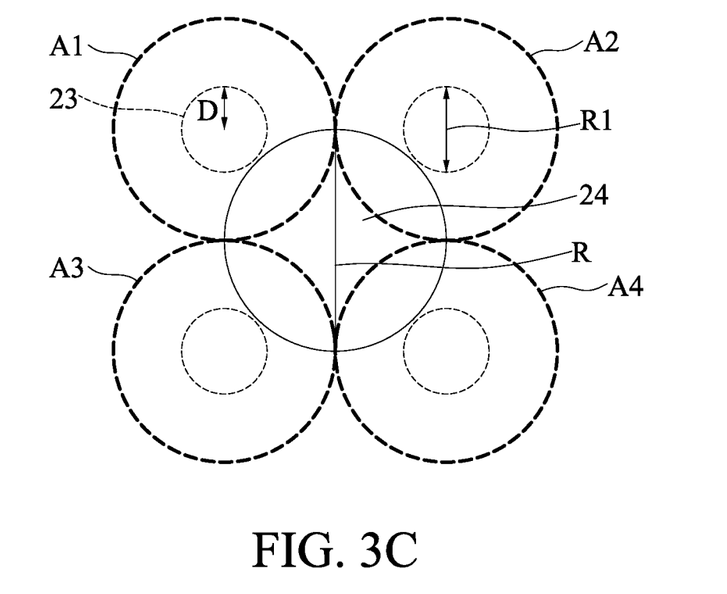

It should be understood that there are many ways for the bonding element 24 to fall into the heat channel S. As shown in FIG. 3C, the position of the bonding element 24 partially intersects the heat channel S (four circular heat-affected zones A1, A2, A3, A4), and the present disclosure is not limited to as such.

Figure 3D:
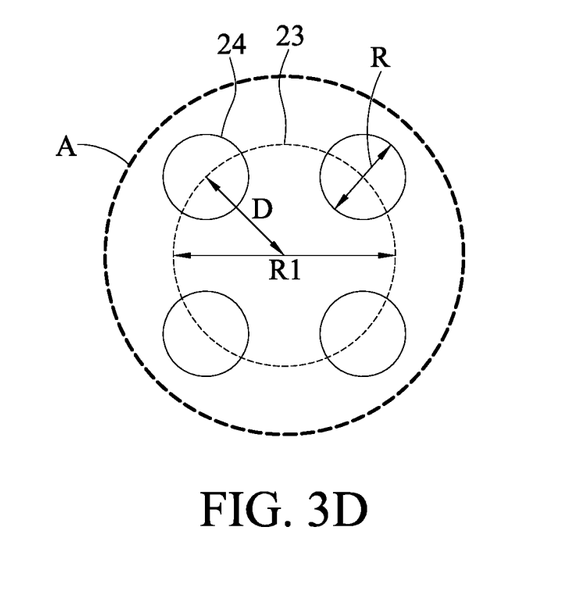

In addition, a single bonding element 24 may correspond to a plurality of pillars, such as the four first pillars 23 shown in FIG. 3C, and the first pillars 23 are symmetrically arranged relative to the bonding element 24, so that the bonding element 24 only partially falls within the range of the heat channel S defined by the four heat-affected zones A1, A2, A3, and A4, wherein the ratio (R1/R or R2/R) of the diameter R1 of the first pillar 23 (or the diameter R2 of the second pillar 28 as shown in FIG. 2D) to the diameter R of the bonding element 24 may be between 0.2 and 0.4. Alternatively, a single pillar corresponds to a plurality of the bonding elements 24, as shown in FIG. 3D, one first pillar 23 corresponds to four bonding elements 24, and the bonding elements 24 are symmetrically arranged relative to the first pillar 23 and fall within the range of the heat channel S completely correspondingly, wherein the ratio (R1/R or R2/R) of the diameter R1 of the first pillar 23 (or the diameter R2 of the second pillar 28 as shown in FIG. 2D) to the diameter R of the bonding element 24 may be between 0.8 and 1.2. It should also be noted that the aforementioned FIG. 3A to FIG. 3D use the first pillar 23 as an illustration, and the bonding element 24 can also at least partially fall into the heat channel S defined by the circular heat-affected zone A of the second pillar 28, so details are not repeated here.

It should be understood that, the number and position of the first pillar 23 and the bonding element 24 can be adjusted with respect to the distribution of the heat-affected zones A, A1, A2, A3, A4 according to requirements, and are not limited to the above.

Figure 2E:
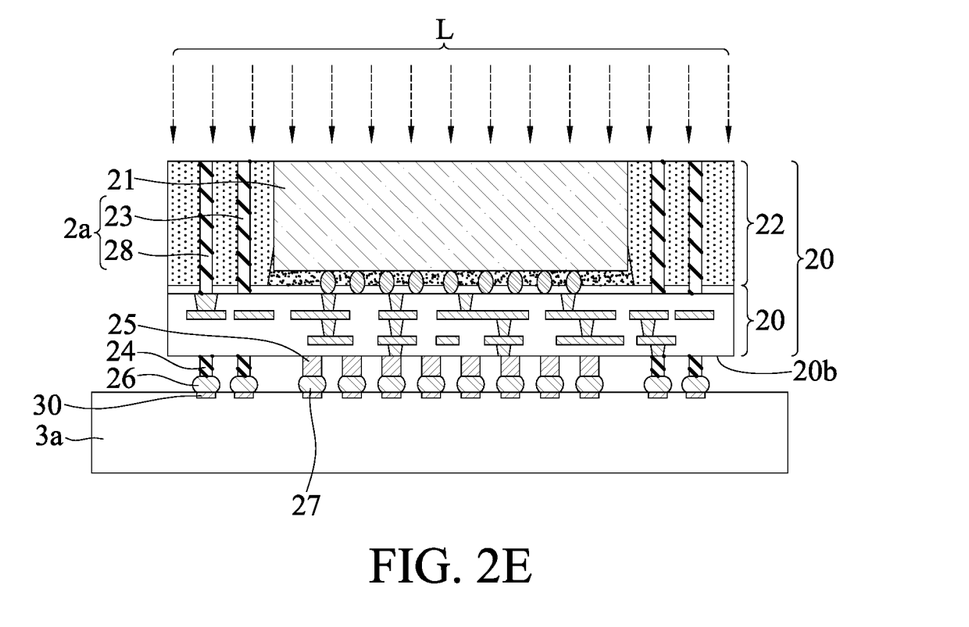
FIG. 2E is a schematic cross-sectional view of the subsequent process of FIG. 2D.

In the subsequent process, as shown in FIG. 2E, the electronic package 2 can be connected onto the contacts 30 of a circuit board 3a with the bonding elements 24 and the conductive elements 25 thereof via the solder materials 26 and 27, and then a reflow process is performed to assist heating and reflowing the solder materials 26, 27 by laser L, wherein the laser L is irradiated from the package layer 22 toward the circuit structure 20. Therefore, the laser L not only transmits heat energy to the second side 20b of the circuit structure 20 by penetrating through the electronic element 21, but also transmits heat energy to the second side 20b of the circuit structure 20 via a heating path (i.e., from the action structure 2a to the heat channel S), so that the heated and reflowed solder material 26 on the bonding element 24 and the heated and reflowed solder material 27 on the conductive element 25 can be strengthened. It should be understood that since the laser L cannot penetrate through the package layer 22, the first and second pillars 23 and 28 of the action structure 2a need to be exposed from the package layer 22 and penetrate through the package layer 22, so that the first and second pillars 23, 28 communicate from the package layer 22 to the circuit structure 20.

Figure 4B:
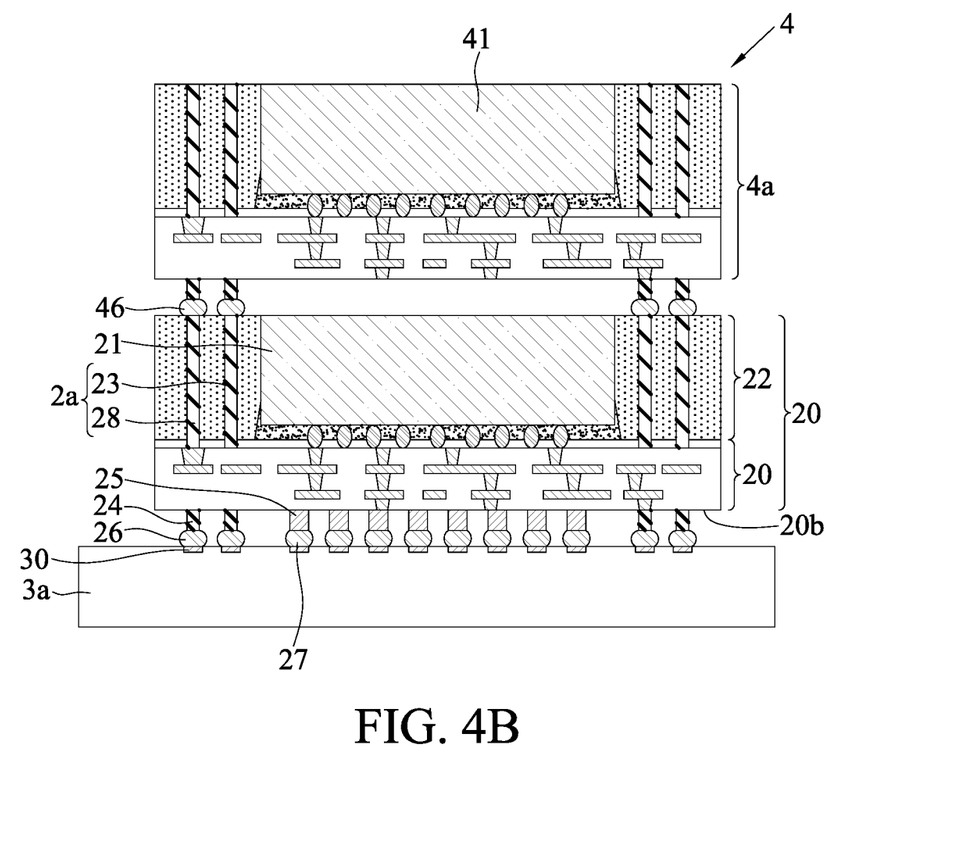
FIG. 4B is a schematic cross-sectional view illustrating another method of the subsequent process of FIG. 2D.

Alternatively, as shown in FIG. 4B, in the subsequent process, at least one package module 4a can be stacked on the end surfaces of the first and second pillars 23, 28 exposed from the package layer 22 via a solder material 46, to form a stacked package 4 (Package on Package [Pa]), wherein the package module 4a includes at least one semiconductor chip 41, so the package module 4a can be designed according to requirements, such as being similar to the aspect of the electronic package 2 in FIG. 2D, and the present disclosure is not limited to as such.

Therefore, in the manufacturing method of the present disclosure, the action structure 2a is embedded in the package layer 22 to serve as a heat conduction path for the laser assisted bonding (LAB) process, so that the laser L can pass through the package layer 22 via the first and second pillars 23, 28 penetrating through the package layer 22 to heat the bonding element 24 under the heat channel S, and the positions of the first and second pillars 23 and 28 and the bonding elements 24 are corresponding to each other up and down, so that the reflowed solder material 26 on the bonding element 24 can be strengthened. Therefore, compared with the prior art, the manufacturing method of the present disclosure can effectively improve the problem of non-wetting of the solder material 26, so that the solder material 26 on the bonding element 24 can be smoothly melted and fastened to the circuit board 3a.

Furthermore, by the position of the bonding element 24 falling within the range of the heat channel S, the heating performance of the LAB process is improved.

Further, in the LAB process, if the circuit structure 20 is a coreless package substrate that is more prone to warping, the benefit of improving the thermal stress problem can be further highlighted by the design of the first pillar 23.

In addition, if the action structure 2a (such as the second pillar 28) is connected to the functional part 202 for grounding of the circuit structure 20, in addition to serving as a heat conduction path for the LAB process, it can also provide a shielding function, and if the action structure 2a (such as the second pillar 28) is connected to the functional part 202 for transmitting signals, it can also provide an electrical path for the upper and lower connection of the stacked package 4.

The present disclosure also provides an electronic package 2, which comprises: a circuit structure 20, at least one electronic element 21, a package layer 22, an action structure 2a and at least one bonding element 24.

The circuit structure 20 has a first side 20a and a second side 20b opposite to the first side 20a.

The electronic element 21 is disposed on the first side 20a of the circuit structure 20.

The package layer 22 is disposed on the first side 20a of the circuit structure 20 to cover the electronic element 21.

The action structure 2a is embedded in the package layer 22 and connected to the first side 20a of the circuit structure 20 and located around the electronic element 21, wherein the action structure 2a is exposed from the surface 22a of the package layer 22.

The bonding element 24 is disposed on the second side 20b of the circuit structure 20 corresponding to the position of the action structure 2a, so that thermal conduction is formed between the bonding element 24 and the action structure 2a.

In one embodiment, the action structure 2a includes a first pillar 23 free from having electrical function.

In one embodiment, the action structure 2a includes a second pillar 28, which is connected to the functional part 202 of the circuit structure 20.

In one embodiment, the circuit structure 20 includes a routing layer 201 such as a fan-out redistribution layer.

In one embodiment, the first and second pillars 23, 28 are used as the center and form a circular heat-affected zone A, A1, A2, A3, A4 by two to three times the radius D of the first and second pillars 23, 28, so that the heat-affected zone A, A1, A2, A3, and A4 is projected vertically in a direction from the first side 20a to the second side 20b, so as to define a heat channel S in the circuit structure 20, so that the bonding element 24 at least partially and correspondingly falls within the range of the heat channel S.

In one embodiment, a single bonding element 24 corresponds to a plurality of the pillars (at least including a plurality of first pillars 23, and may include the second pillar 28 according to requirements).

In one embodiment, the single first pillar 23 or the second pillar 28 corresponds to a plurality of the bonding elements 24.

In one embodiment, the diameter ratio (R1/R) of the first pillar 23 to the bonding element 24 is 0.2 to 0.4 or 0.8 to 1.2, and the diameter ratio (R2/R) of the second pillar 28 to the bonding element 24 is 0.2 to 0.4 or 0.8 to 1.2.

To sum up, in the electronic package and the manufacturing method thereof of the present disclosure, the action structure is embedded in the package layer, so that the laser can pass through the package layer and heat the bonding element under the heat channel via the action structure, thereby transferring heat energy to the bonding element to reflow the solder material thereon. Therefore, the present disclosure can effectively improve the problem of non-wetting of the solder material.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a circuit structure having a first side and a second side opposing the first side;
   an electronic element disposed on the first side of the circuit structure;
   a package layer disposed on the first side of the circuit structure to cover the electronic element;
   at least one action structure embedded in the package layer and located around the electronic element, wherein the action structure is exposed from an upper surface of the package layer and connected to the first side of the circuit structure; and
   at least one bonding element disposed on the second side of the circuit structure and corresponding to a position of the action structure, wherein a thermal conduction is formed between the bonding element and the action structure, wherein the action structure includes a single pillar or a plurality of pillars, and wherein the at least one bonding element includes a single bonding element or a plurality of bonding elements, such that the single bonding element corresponds to at least two of the pillars or the single pillar corresponds to the plurality of the bonding elements.

2. The electronic package of claim 1, wherein a said pillar is free from having electrical function.

3. The electronic package of claim 1, wherein the action structure is connected to a functional part of the circuit structure.

4. The electronic package of claim 1, wherein the circuit structure includes a fan-out redistribution layer.

5. The electronic package of claim 1, wherein a said pillar is used as a center and forms a circular heat-affected zone by two to three times a radius of the pillar, and wherein the heat-affected zone is projected vertically in a direction from the first side to the second side to define a heat channel in the circuit structure, such that a said bonding element at least partially and correspondingly falls within a range of the heat channel.

6. The electronic package of claim 1, wherein a ratio of a diameter of a said pillar to a diameter of a said bonding element is 0.2 to 0.4 or 0.8 to 1.2.

7. A method of manufacturing an electronic package, comprising:
providing a circuit structure having a first side and a second side opposing the first side;
disposing an electronic element on the first side of the circuit structure;
forming a package layer on the first side of the circuit structure to cover the electronic element, and embedding at least one action structure in the package layer around the electronic element, wherein the action structure is exposed from an upper surface of the package layer and connected to the first side of the circuit structure; and
forming at least one bonding element on the second side of the circuit structure, wherein the at least one bonding element corresponds to a position of the action structure, such that a thermal conduction is formed between the at least one bonding element and the action structure, wherein the action structure includes a single pillar or a plurality of pillars, and wherein the at least one bonding element includes a single bonding element or a plurality of bonding elements, such that the single bonding element corresponds to at least two of the pillars or the single pillar corresponds to the plurality of the bonding elements.

8. The method of claim 7, wherein a said pillar is free from having electrical function.

9. The method of claim 7, wherein the action structure is connected to a functional part of the circuit structure.

10. The method of claim 7, wherein the circuit structure includes a fan-out redistribution layer.

11. The method of claim 7, wherein said pillar is used as a center and forms a circular heat-affected zone by two to three times a radius of the pillar, and wherein the heat-affected zone is projected vertically in a direction from the first side to the second side to define a heat channel in the circuit structure, such that a said bonding element at least partially and correspondingly falls within a range of the heat channel.

12. The method of claim 7, wherein a ratio of a diameter of a said pillar to a diameter of a said bonding element is 0.2 to 0.4 or 0.8 to 1.2.

13. The method of claim 7, wherein the action structure is first formed on the first side of the circuit structure, and then the package layer covers the action structure and the electronic element together.

14. The method of claim 7, wherein after disposing the electronic element on the first side of the circuit structure, the package layer is made to cover the electronic element, and then at least one through via exposing the first side is formed on the package layer, and then a metal material is filled in the at least one through via to form the action structure.

* * * * *